United States Patent [19]

Easter et al.

[11] Patent Number: 4,820,653

[45] Date of Patent: Apr. 11, 1989

[54] TECHNIQUE FOR FABRICATING COMPLEMENTARY DIELECTRICALLY ISOLATED WAFER

[75] Inventors: William G. Easter, Reading; Daniel D. Leffel, Earl Township, Berks County, both of Pa.

[73] Assignees: American Telephone and Telegraph Company; AT&T Technologies, Inc., both of Berkeley Heights, N.J.

[21] Appl. No.: 155,409

[22] Filed: Feb. 12, 1988

[51] Int. Cl.⁴ .................. H01L 29/06; H01L 29/165
[52] U.S. Cl. ........................ 437/62; 437/78; 437/90
[58] Field of Search .............. 437/61, 62, 63, 78, 437/90

[56] References Cited

U.S. PATENT DOCUMENTS

| | | | |
|---|---|---|---|
| 4,416,050 | 11/1983 | Sarace | 437/57 |
| 4,528,047 | 7/1985 | Beyer et al. | 156/644 |
| 4,554,059 | 11/1985 | Short et al. | 204/129.3 |
| 4,579,625 | 4/1986 | Tabata et al. | 156/643 |
| 4,593,458 | 6/1986 | Adler | 357/52 |
| 4,624,047 | 11/1986 | Tani | 357/42 |

FOREIGN PATENT DOCUMENTS

| | | | |
|---|---|---|---|
| 0043385 | 4/1977 | Japan | 437/72 |
| 0232440 | 12/1984 | Japan | 437/72 |
| 0182738 | 9/1985 | Japan | 437/78 |
| 0224431 | 10/1986 | Japan | 437/68 |

OTHER PUBLICATIONS

Conversion of the Conductivity Mode in Silicon by Oxygen Ion Implantation and Its Application in a Novel Dielectric Isolation Technique, J. Y. Chi and R. P. Holmstrom, Appl. Phys. Lett. 40(5), Mar. 1, 1982, pp. 420–422.

*Primary Examiner*—Olik Chaudhuri
*Attorney, Agent, or Firm*—Wendy W. Koba

[57] ABSTRACT

A method has been developed for providing tub regions with various resistivities in a dielectrically isolated (DI) structure. The starting substrate material is etched to expose the locations designated for a resistivity modification, and epitaxial material of the modified resistivity value is used to fill the exposed tubs. The remainder of the fabrication process follows conventional DI fabrication techniques. The procedure may simply be used to create a DI structure containing both n-type and p-type tube regions. The idea may also be extended, however, to providing separate tubs with, for example, n+ resistivity, n− resistivity, p− resistivity and p+ resistivity, all within the same DI structure.

4 Claims, 3 Drawing Sheets

TECHNIQUE FOR FABRICATING COMPLEMENTARY DIELECTRICALLY ISOLATED WAFER

BACKGROUND OF THE INVENTION

1. Field of the Invention

The present invention relates to a technique for fabricating a complementary dielectrically isolated (DI) wafer structure and, more particularly, to a fabrication technique wherein the initial substrate material is altered to contain regions of both conductivity types.

2. Description of the Prior Art

For high voltage integrated device structures, some type of isolation between certain active regions is required to prevent premature breakdown of the device. Junction isolation, formed by including additional p-n junctions in the device structure, may be used for this purpose. However, these p-n junctions have a voltage limit themselves, and add to the over-all area occupied by the structure. As an alternative, dielectric isolation (DI) is used to surround the complete device with a layer of dielectric material. Many references exist in the prior art which describe this type of structure.

In many sophisticated circuit applications, it is required to provide both n-type and p-type devices on the same substrate (complementary structures). It is also useful in many applications to form separate regions with differing resistivities. Accomplishing these types of structures using dielectric isolation has been a formidable problem in the past. One solution is disclosed in U.S. Pat. No. 4,579,625 issued to A. Tabata et al. on Apr. 1, 1986. The method taught by Tabata et al. includes forming a plurality of projecting p-type polysilicon regions above a substrate surface, removing selected projections which are to be areas of n-type conductivity, and growing an n-type epitaxial layer over the entire surface of the device. The structure is then anisotropically etched to form n-type projections. The Tabata et al. process requires at least five photoresist operations, four silicon etches, and various other etching operations to form the complete structure.

An alternative fabrication technique is disclosed in U.S. Pat. No. 4,593,458 issued to M. S. Adler on June 10, 1986. Adler forms DI regions (tubs) of lightly-doped n-type conductivity and then selectively ion implants the various tubs to form either n-tubs or p-tubs. However, ion implantation as a doping method necessarily limits the type of final device formed to lateral devices only, since the diffusion gradient of the ion implanted species drops off at a rate such that the bottom area of the tub is rather lightly doped. Additionally, Adler discusses the formation of the epitaxial tub material directly on the conventional DI tub boundary of silicon dioxide. The process of forming an epitaxial region on top of a layer of silicon dioxide is not well understood, and is, at best, difficult to achieve.

U.S. Pat. No. 4,624,047 issued to S. Tani on Nov. 25, 1986 discloses yet another alternative method of forming complementary DI tubs. Tani replaces the projection-forming method of Tabata et al. with a method of forming p-type regions directly in an n-type substrate, through ion implantation, then processing with conventional DI processing to form the n-type and p-type tubs. As with the Adler structure, however, the use of ion implantation to form the p-type regions limits the downward diffusion of the dopant, restricting the final device structure to a latter form.

Therefore, a need remains for a complementary DI structure which is relatively easy to fabricate and allows for the formation of vertical, as well as lateral, device structures.

SUMMARY OF THE INVENTION

The need remaining in the prior art is addressed by the present invention which relates to a technique for fabricating a complementary dielectrically isolated (DI) wafer structure and, more particularly, to a fabrication process wherein the initial substrate material is altered to contain regions of both conductivity types.

In accordance with the teachings of the present invention, a conventional single crystal substrate of a first conductivity type is etched to expose regions which are designed to be of the opposite conductivity type. Epitaxial material of the opposite conductivity type is then utilized to fill these designated areas. The substrate is then planarized, and conventional DI processing is resumed.

It is an aspect of the present invention to provide for the inclusion of a multiple location which may comprise various resistivities, where a concomitant number of etch and epitaxial formation processes are performed for each desired resistivity value.

Other and further aspects of the present invention will become apparent during the course of the following discussion and by reference to the accompanying drawings.

BRIEF DESCRIPTION OF THE DRAWING

Referring now to the drawings.

DETAILED DESCRIPTION

The following description of the technique of the present invention illustrated by FIGS. 1–6 will relate to the formation of n-type tub regions in a p-type substrate. It is to be understood, however, that the technique of the present invention is equally applicable to theformation of p-tubs in an n-type substrate. Further, as will be described in detail hereinafter in association with FIGS. 7–9, the present technique may be uutilized to form a number of tub regions of like conductivity type, each comprising a different resistivity value.

Figure 1:
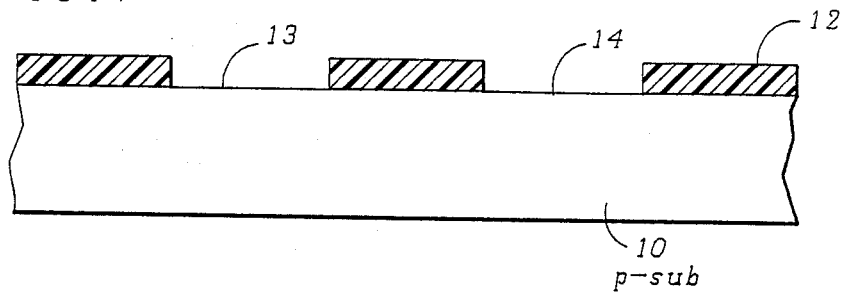
FIGS. 1–7 illustrate an exemplary fabrication process for forming a DI substrate with regions of altered conductivity in accordance with the teachings of the present invention.

FIG. 1 illustrates the starting point of the inventive technique wherein a p-type silicon substrate 10 is covered by a mask layer 12 which is patterned and etched to expose the designated locations 13,14 of n-type tub regions. It is to be understood, as mentioned above, that the selected locations 13,14 may instead by altered in P-type resistivity value (to form regions of p+ or p− resistivity, for example).

Figure 2:
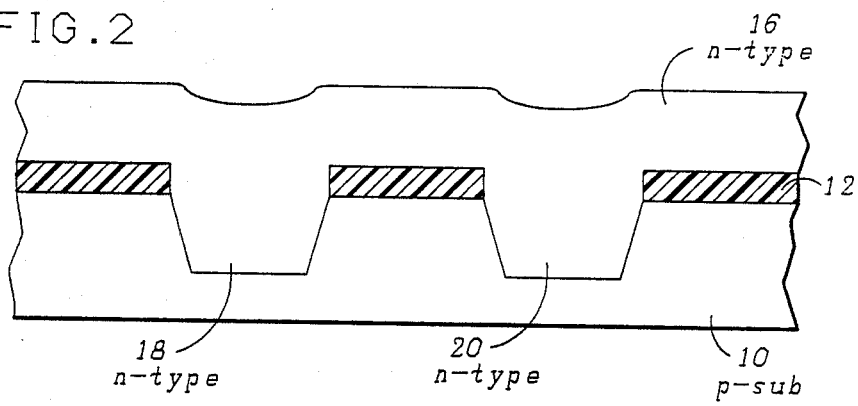

Once locations 13 and 14 have been exposed, an appropriate etch (with KOH, for example) is utilized to remove a predetermined amount of substrate material from these locations. Subsequent to this etch, an epitaxial layer 16 is grown. For the formation of n-type tubs, an n-type epitaxial layer is grown. Layer 16 may be grown utilizing a chemical vapor deposition (CVD)

process, where the CVD process is considered to be the preferred method. This process results in the formation of n-type monocrystalline epitaxial regions 18 and 20, as shown in FIG. 2.

Figure 3:
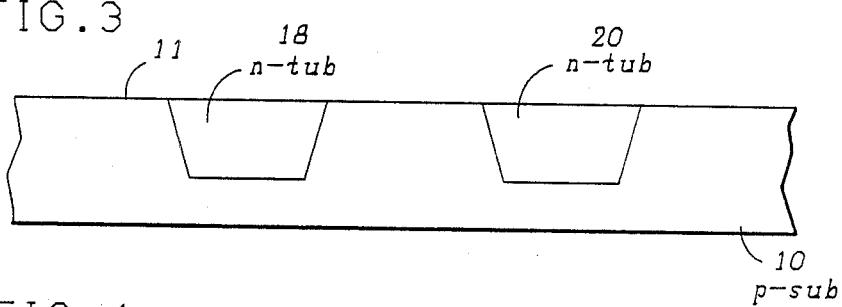

The exposed epitaxial material 22 and mask layer 12 are then removed using an appropriate technique to form an essentially planar top surface 11. For example, these layers may be removed by grinding and polishing. The resulting structure, as shown in FIG. 3, comprises a p-type substrate 10 and a pair of n-tubs 18 and 20. It is to be understood that the formation of a pair of tubs is exemplary only, and that any desired number of complementary regions may be formed using the present technique.

The remainder of the process merely follows conventional DI fabrication techniques, using p-substrate 10 containing n-tubs 18 and 20 as the starting material. For the sake of completeness, an exemplary DI fabrication process will be briefly described. It is to be understood, however, that the following description is exemplary, however, that the following description is exemplary only; various DI fabrication processes exist and any may be utilized with the techniques of the present invention.

Figure 4:
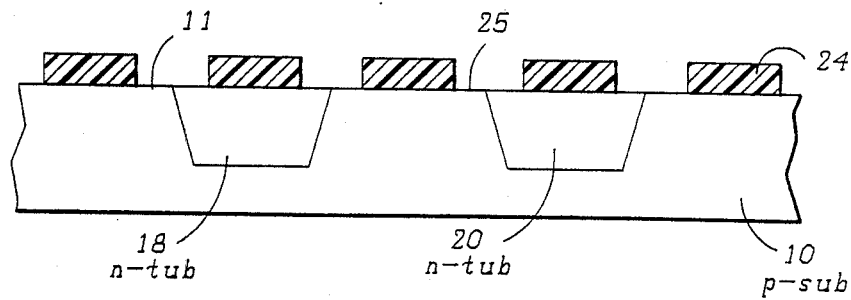
Figure 5:
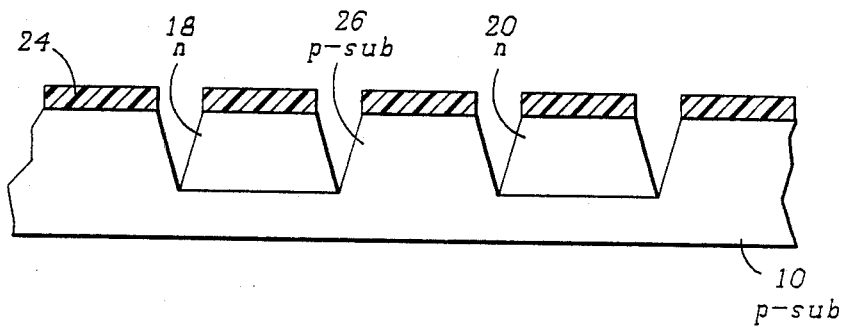
Figure 6:
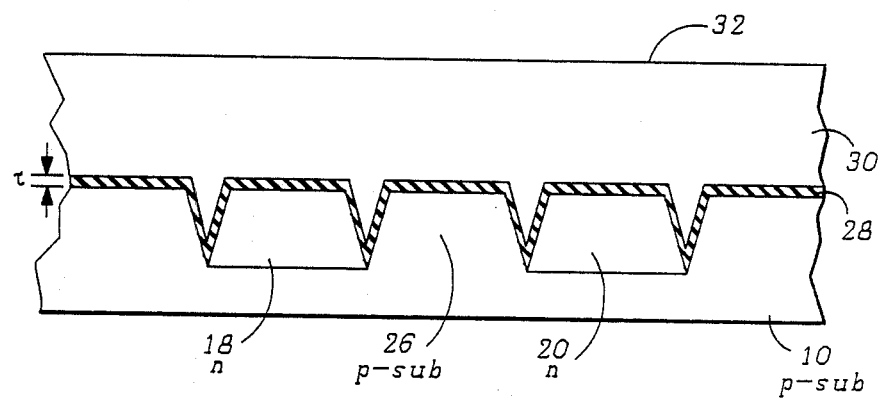
Figure 7:
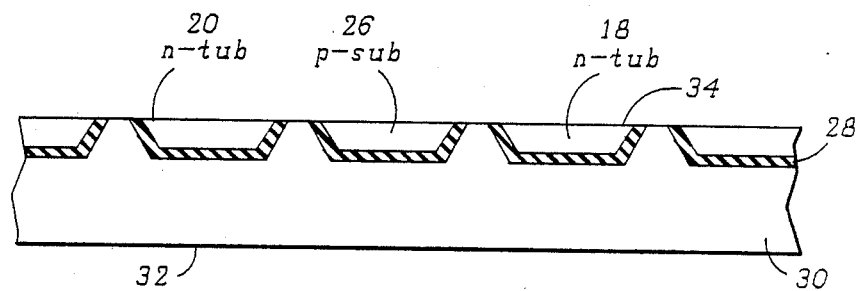

Referring to FIG. 4, a mask layer 24 is grown and patterned on top surface 11 of substrate 10, where windows 25 in layer 24 indicate the locations for the growth of the dielectric material utilized to isolate adjacent tub regions. An anisotropic etch, using a mixture of KOH and alcohol, for example, is then performed, as shown in FIG. 5. Subsequent to this etch, mask layer 24 is removed and an oxide layer 28 is grown to completely cover the exposed surface of the material. As is well-known in the DI fabrication process, oxide layer 28 is grown to a predetermined thickness, t, capable of providing sufficient electrical isolation between adjacent tub regions. Lastly, a thick polysilicon layer 30 is deposited to cover oxide layer 28. Polysilicon layer 30 is often referred to as a "polysilicon handle", since this layer is used to provide mechanical support for subsequent grinding and polishing operations. FIG. 6 illustrates the device at the completion of the polysilicon deposition process.

Polysilicon layer 30 is then planarized to comprise an essentially flat top surface 32, where the planarity of surface 32 is then used as a guide for the grinding and polishing operations. In accordance with the final steps of the DI substrate fabrication process, the device as illustrated in FIG. 6 is inverted so that polysilicon layer 30 is underneath the semiconductor areas, with planar surface 32 defined as the bottom surface of the DI structure. As seen by reference to FIG. 7, substrate 10 is then ground until n-tubs 18 and 20 are exposed. This structure is then polished until a top surface 34 is essentially coplanar with bottom surface 32. It is to be understood that various combinations of grinding and polishing operations may be used to arrive at the illustrated structure, where any suitable method is deemed to fall within the scope of the teachings of the present invention as related to the alteration of the substrate starting material to contain regions of various resistivities.

As mentioned above, the technique of the present invention may also be used to create tub regions with different resistivities. In fact, it is possible to create a DI structure which contains numerous tub regions of varying resistivities. An exemplary process illustrating this advantage of the present invention is illustrated in FIGS. 8-10.

Figure 8:
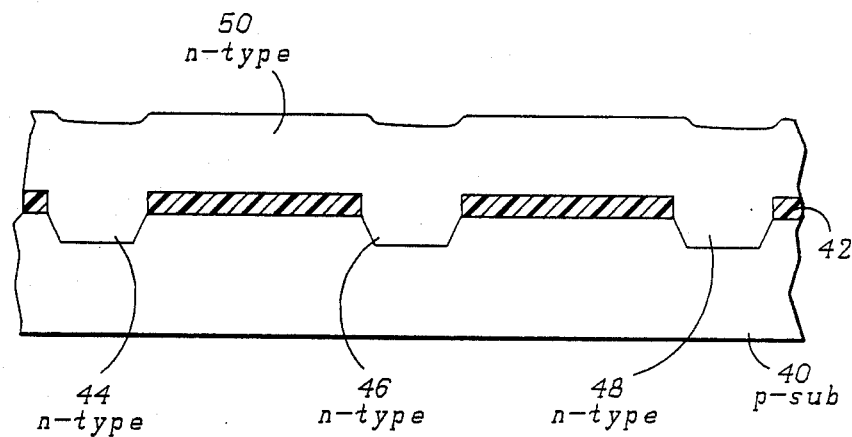
FIGS. 8–10 illustrate selected steps in an alternative fabrication process which allows for the formation of multiple tubs of various resistivities.

FIG. 8 illustrates a particular structure at the stage in the fabrication process where the doped epitaxial material is deposited into the designated tubs (similar to FIG. 2 discussed above). In this example, a p-substrate 40 has been patterned with a mask 42 to define a set of n-tub locations 44, 46 and 48. N-type epitaxial material is then deposited (using a CVD technique, for example) so as to at least fill tub locations 44, 46 and 48. Subsequent to this epitaxial growth, the exposed epitaxial material, as well as mask layer 42, is removed. Up to this point, the process is identical to that described above in association with FIGS. 1-7.

Figure 9:
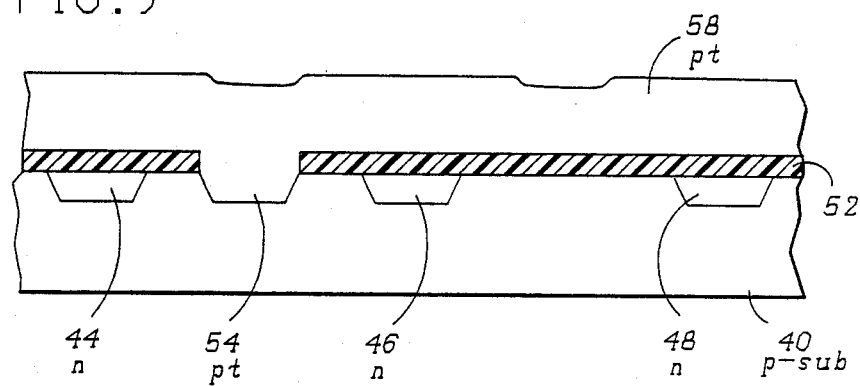
Figure 10:
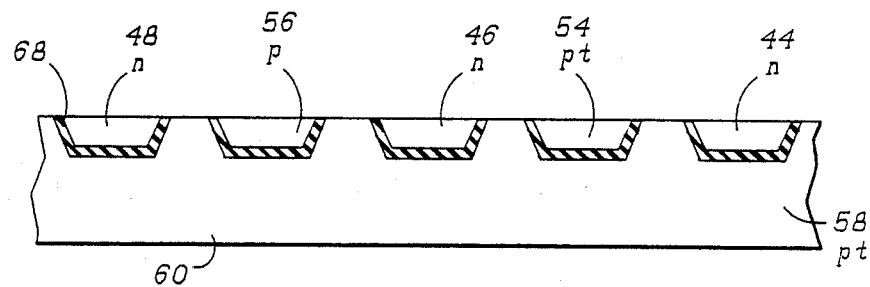

FIG. 9 illustrates the following steps in the process which differ from the process described above. In particular, the next step is to pattern the structure with a mask layer 52 which defines the location of another set of tub regions. In this particular example, it is desired to create a tub region 54 with a lesser resistivity than the substrate material. As before, the structure is etched to expose this designated location and a $p^+$-type epitaxial layer 58 is deposited to at least fill tub region 54. Again, the exposed portion of epitaxial layer 58 and mask layer 52 is removed using a suitable process (grinding and polishing, for example).

The remaining sequence of steps, related to the formation of a conventional p-tub 56 and the associated dielectric isolation of all of the tubs, is similar to that described above and will not be repeated here. The final DI structure is illustrated in FIG. 10. It is to be noted, however, that this particular process of forming numerous regions with various resistivities may be repeated more than twice. For example, a structure could conceivably be formed to comprise tubs of $n+$, $n-$, $p+$, and $p-$ resistivities.

In association with the above-described multiple tub structure, it becomes practical to utilize a selective epitaxial growth process. In a selective epitaxial growth process, the epitaxial material will grow only over a single crystal surface, and the growth process may be easily terminated (through reactor control) when the desired thickness is attained. In this case, therefore, with reference to FIG. 8, the n-type epitaxial material grown with a selective process, is controlled to fill only tub regions 44, 46 and 48. This selective process somewhat simplifies the fabrication, since mask layer 42 may then simply be removed with a common etchant, eliminating the need for any grinding or polishing.

What is claimed is:

1. In the fabrication of a dielectrically isolated device, a method of forming regions of at least two different resistivities, in the initial silicon substrate, the method comprising the steps of:
   (a) providing a single crystal silicon substrate of a first conductivity type;
   (b) patterning said substrate to define locations selected to comprise a first resistivity value;
   (c) etching said substrate to remove material from the locations defined in step (b);
   (d) forming epitaxial material of the first resistivity value in the locations exposed in step (c);
   (e) repeating steps (b)-(d) for subsequent group locations, each group defined to comprise a different resistivity value.

2. The method of claim 1 wherein the substrate is p-type and n-type polysilicon is formed in step (d).

3. The method of claim 1 where in performing step (d), a chemical vapor deposition technique is used to form the epitaxial material.

4. The method of claim 1 where in performing step (d), a selective epitaxial growth process is used to form the epitaxial material.

* * * * *